(12) United States Patent
Waller et al.

(10) Patent No.: US 12,087,350 B2
(45) Date of Patent: Sep. 10, 2024

(54) MULTI-DECK NON-VOLATILE MEMORY ARCHITECTURE WITH IMPROVED WORDLINE BUS AND BITLINE BUS CONFIGURATION

(71) Applicant: Intel Corporation, Santa Clara, CA (US)

(72) Inventors: William Waller, Eagle, ID (US); Cheng-Yi Huang, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 836 days.

(21) Appl. No.: 17/032,191

(22) Filed: Sep. 25, 2020

(65) Prior Publication Data
US 2022/0101909 A1   Mar. 31, 2022

(51) Int. Cl.
| G11C 11/408 | (2006.01) |
| G11C 5/02 | (2006.01) |
| G11C 5/06 | (2006.01) |
| G11C 11/4094 | (2006.01) |

(52) U.S. Cl.
CPC .......... *G11C 11/4087* (2013.01); *G11C 5/025* (2013.01); *G11C 5/06* (2013.01); *G11C 11/4085* (2013.01); *G11C 11/4094* (2013.01)

(58) Field of Classification Search
CPC ............ G11C 11/4087; G11C 11/4085; G11C 11/4094; G11C 5/025; G11C 5/06

USPC ..................................................... 365/230.06
See application file for complete search history.

(56) References Cited

U.S. PATENT DOCUMENTS

| 5,930,184 A * | 7/1999 | Waller ................... G11C 29/12 365/201 |
| 7,889,538 B2 * | 2/2011 | Toda ........................ G11C 8/12 365/100 |
| 8,848,424 B2 * | 9/2014 | Ikeda .................... G11C 13/003 365/46 |
| 2005/0243595 A1 * | 11/2005 | Rinerson ............. G11C 13/0011 365/148 |
| 2021/0407564 A1 * | 12/2021 | Dongaonkar ........ G11C 7/1006 |

* cited by examiner

*Primary Examiner* — Connie C Yoha
(74) *Attorney, Agent, or Firm* — Jordan IP Law, LLC

(57) ABSTRACT

Systems, apparatuses and methods may provide for a multi-deck non-volatile memory architecture with an improved wordline bus and bitline bus configuration. For example, wordline busses and bitline busses may be positioned so as to be located over the junctions between two tiles, e.g., between a memory tile and a termination tile and between two memory tiles. Additionally, multi-deck non-volatile memory architectures may utilize data shifting to select which one of a plurality of wordline drivers and a plurality of bitline drivers are in communication with a data circuit of each memory tile. In a configuration where wordline busses and bitline busses have been positioned so as to be located over the junctions between two tiles, such data shifting directions may be able to be implemented with a limited number of shifting direction.

20 Claims, 15 Drawing Sheets

MULTI-DECK NON-VOLATILE MEMORY ARCHITECTURE WITH IMPROVED WORDLINE BUS AND BITLINE BUS CONFIGURATION

TECHNICAL FIELD

Embodiments generally relate to memory structures. More particularly, embodiments relate to multi-deck non-volatile memory architectures with an improved wordline bus and bitline bus configuration.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. Three-dimensional memory devices have emerged as a solution to the scaling limitations of traditional memory devices.

Such three-dimensional memory devices may include a multi-deck non-volatile memory architecture. However, existing multi-deck non-volatile memory architectures may have hardware circuitry than might be reduced. In such an example, a device with such reduced hardware circuitry might be produced at a smaller overall size and at a reduced cost.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

A variety of memory and storage technologies include multiple decks or layers of memory cells as part of the vertical address space. Adding decks or layers of memory cells may result in a larger memory size per the same die size. Memory with multiple decks or layers (e.g., a multi-deck architecture in the vertical direction) is typically referred to as three-dimensional (3D). Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2X-layer NAND device). The term "deck" will be used throughout this disclosure to describe a layer, a tier, or a similar portion of a three-dimensional memory.

As discussed above, existing multi-deck non-volatile memory architectures may have hardware circuitry that might be reduced. In such an example, a device with such reduced hardware circuitry might be produced at a smaller overall size and at a reduced cost.

As will be described in greater detail below, implementations described herein may provide a multi-deck non-volatile memory architecture with an improved wordline bus and bitline bus configuration. For example, wordline busses and bitline busses may be positioned so as to be located over the junctions between two tiles, e.g., between a memory tile and a termination tile and between two memory tiles. Such a implementations may permit for a reduction in hardware circuitry to produce devices at a smaller overall size and at a reduced cost.

Additionally, multi-deck non-volatile memory architectures may utilize data shifting to select which one of a plurality of wordline drivers and a plurality of bitline drivers are in communication with a data circuit of each memory tile. In a configuration where wordline busses and bitline busses have been positioned so as to be located over the junctions between two tiles, such data shifting directions may be able to be implemented with a limited number of data shifting directions and with an increased symmetry of bus loading. For example, the symmetry of the bus loading for all occurrences will produce a more consistence timing within the multi-deck non-volatile memory architectures.

Figure 1:
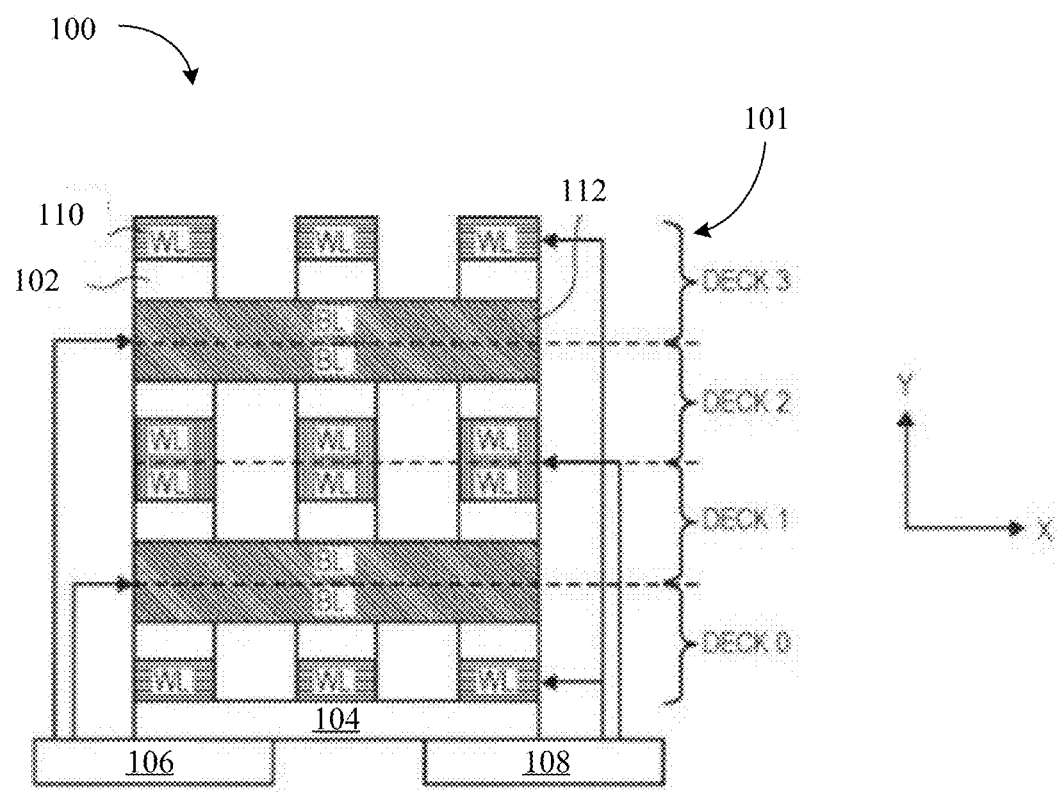
FIG. 1 is a block diagram of an example of a multi-deck non-volatile memory device according to an embodiment.

FIG. 1 is a block diagram of an example of a multi-deck non-volatile memory device 100 according to an embodiment. As illustrated, the multi-deck non-volatile memory device 100 may include a plurality of decks 101 (e.g., Deck 0, Deck 1, Deck 2, and Deck 3, or the like).

In some implementations, each of the decks 101 may include an array of memory cells 102 with conductive access lines (e.g., wordlines 110 and bitlines 112). For example, the memory cells 102 may include a material capable of being in two or more stable states to store a logic value. In one example, the memory cells 102 may include a phase change material, a chalcogenide material, the like, or combinations thereof. However, any suitable storage material may be utilized. The wordlines 110 and bitlines 112 may be patterned so that the wordlines 110 are orthogonal to the bitlines 112, creating a grid pattern or "cross-points." A cross-point is an intersection between a bitline, a wordline, and active material(s) (e.g., a selector and/or a storage material). A memory cell 102 may be located at the intersection of a bitline 110 and a wordline 112. Accordingly, one or more of the decks 101 may include a crosspoint array of non-volatile memory cells, where each of the memory cells may include a material capable of being in two or more stable states to store a logic value.

As illustrated, an electrically isolating material 104 may separate the conductive access lines (e.g., wordlines 110 and bitlines 112) of the bottom deck (e.g., deck 0) from bitline sockets 106 and wordline sockets 108. For example, the memory cells 102 may be coupled with access and control circuitry for operation of the three-dimensional memory device 100 via the bitline sockets 106 and the wordline sockets 108.

The crosspoint memory array of FIG. 1 is one example of multi-deck non-volatile memory device 100, however, the techniques described herein may not be limited to crosspoint memory, but any memory device with multiple layers or decks of memory cells. Thus, memory systems may be designed to have one or more packages, each of which may include one or more memory dies. As will be discussed below, each memory die may include multiple partitions and multiple decks.

Figure 2:
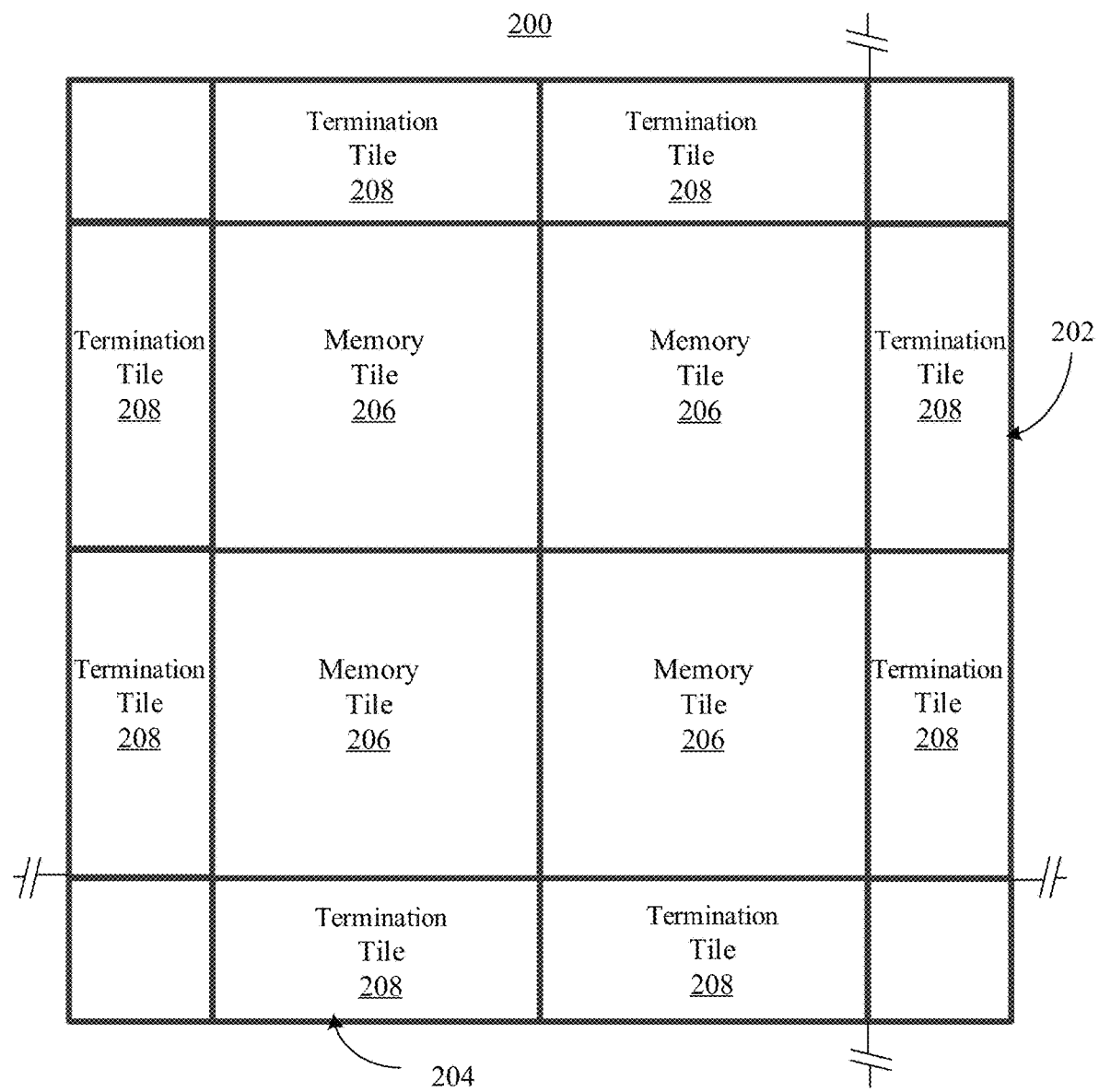
FIG. 2 is an illustration of an example of a memory partition according to an embodiment.

FIG. 2 is an illustration of an example of a memory partition 200 according to an embodiment. As illustrated, the memory partition 200 may be included as part of one or more decks (e.g., see FIG. 1). For example, the memory partition 200 may include a plurality of memory tile rows 202 and a plurality of memory tile columns 204.

The plurality of memory tile rows 202 and a plurality of memory tile columns 204 may be formed of a plurality of memory tiles 206. For example, the memory partition 200 may be a 128 tile partition. In such an example, the memory partition 200 may be sized to include 8 memory tiles 206 in a first dimension and 16 memory tiles 206 in another dimension, resulting in a 128 tile partition.

In some implementations, a plurality of termination tiles 208 may be located at either end of the plurality of memory tile rows 202 and either end of the plurality of memory tile columns 204. As used herein the term "termination tile" refers to tiles at the outer edges of an array of tiles in the partition 200. For example, memory tiles 206 near the edges of the partition 200 may have either wordlines and/or bitlines that are not driven. Accordingly, termination tiles 208 may be added around these memory tiles 206 near the edges of the partition 200 to provide access to these un-selectable memory cells. Wordline decoders and/or bitline decoders (see, e.g., wordline decoders 402 and 404 and bitline decoders 406 and 408, as will be discussed in further detail below in FIG. 4A) in the termination tiles 208 may enable the accesses to these un-selectable memory cells.

Figure 3:
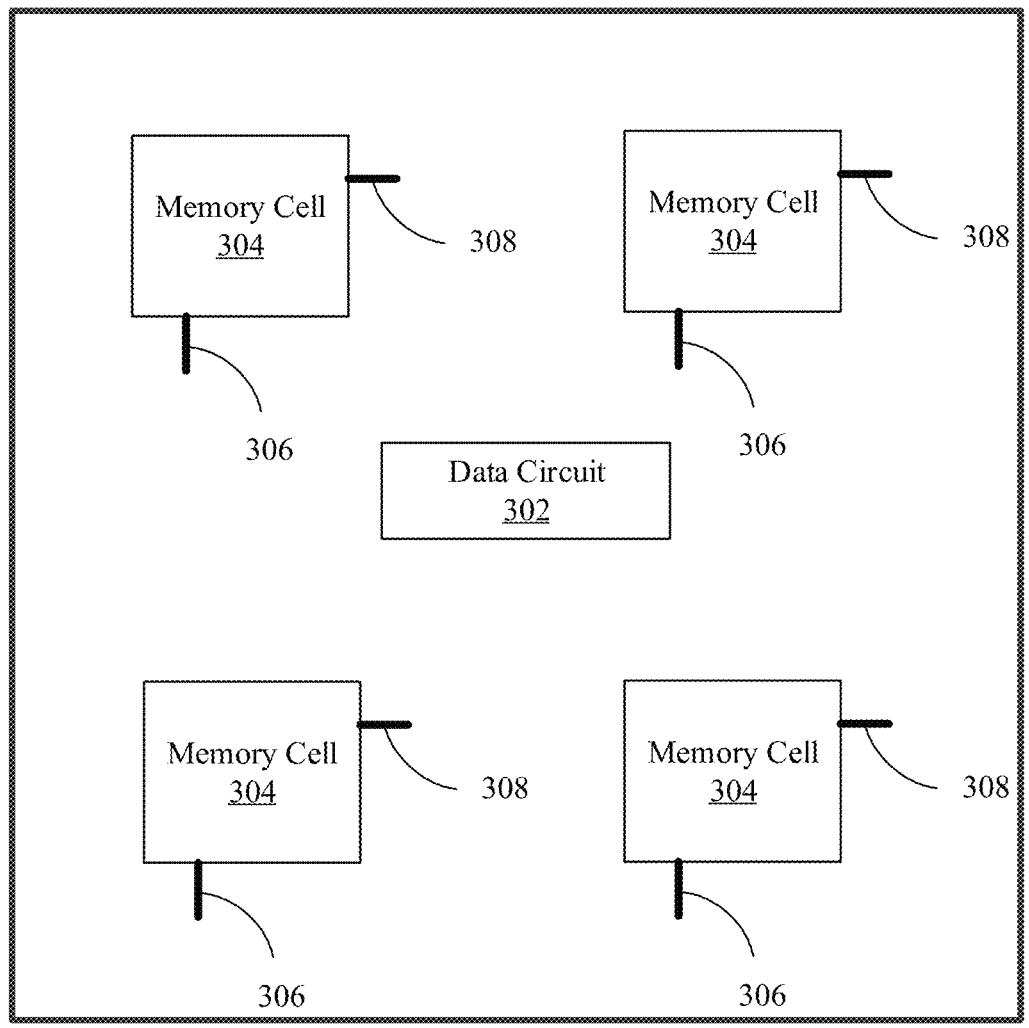
FIG. 3 is an illustration of an example of a memory tile according to an embodiment.

FIG. 3 is an illustration of an example of the memory tile 206 according to an embodiment. As illustrated, the memory tile 206 may include a data circuit 302 coupled to a plurality of memory cells 304. In some implementations, the data circuit 302 may provide access to a data state of the memory cells 304. For example, the data circuit 302 may provide write data to wordline drivers and bitline drivers (see, e.g., wordline drivers 504 and bitline drivers 508 of FIG. 5, as will be discussed in further detail below). The data circuit 302 may also send read data from the bitline drivers to the wordline drivers and send read data to data output circuitry.

In some implementations, the memory cells 304 may be accessed via a plurality of wordlines 306 and bitlines 308. For example, each of the memory cells 304 may be located at an intersection of one of wordlines 306 and one of the bitlines 308.

Figure 4A:
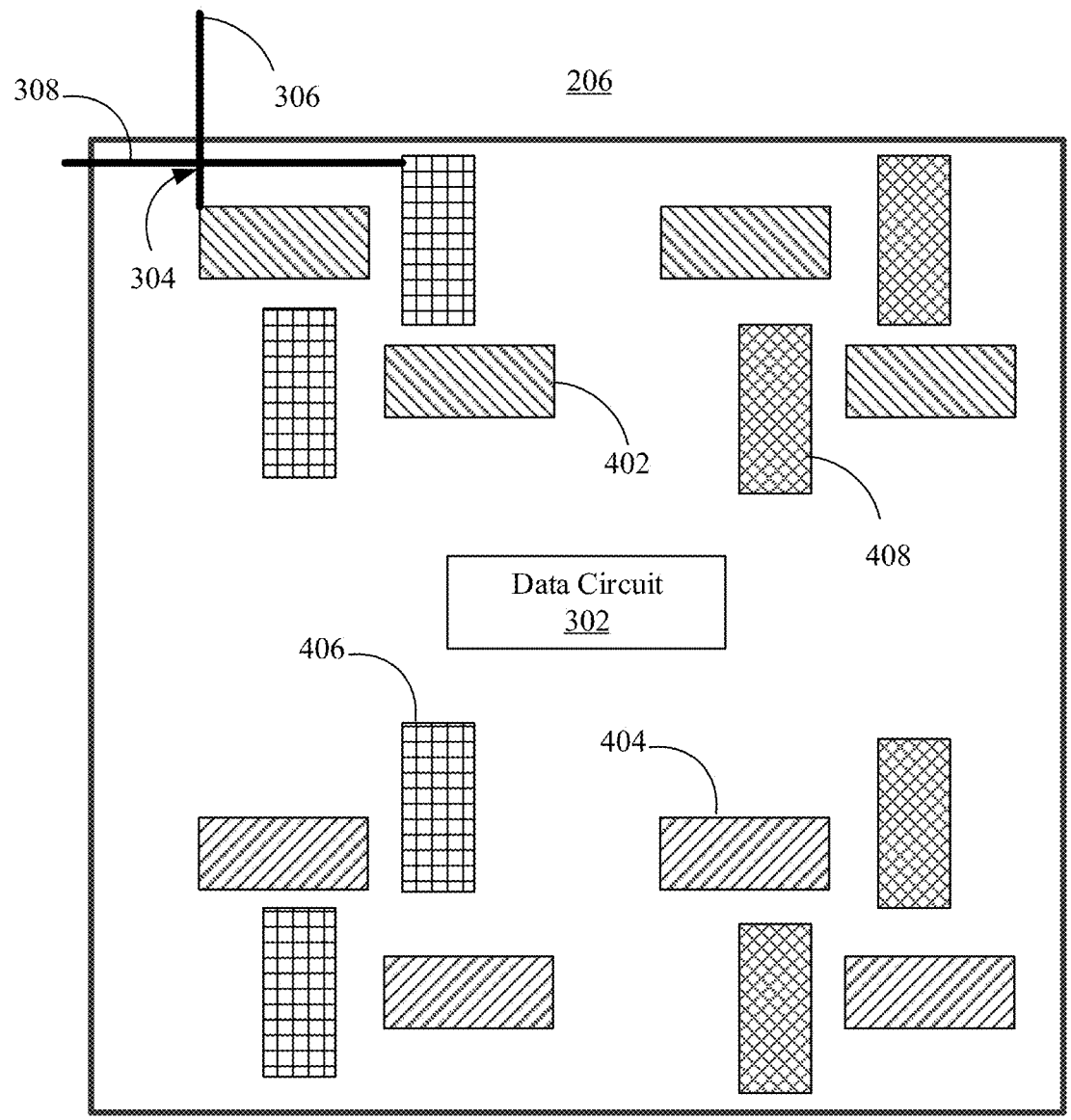
FIG. 4A is another illustration of an example of a memory tile according to an embodiment.

FIG. 4A is another illustration of an example of the memory tile 206 according to an embodiment. As illustrated, the memory tile 206 may include several decoders, such as a first set of wordline decoders 402, a second set of wordline decoders 404, a first set of bitline decoders 406, and a second set of bitline decoders 408. For example, the various sets of decoders 402, 404, 406, and 408 may be interwoven through the various decks. In the illustrated example, the first set of wordline decoders 402 may be connected to deck 1 and deck 2, the second set of wordline decoders 404 may be connected to deck 0 and deck 3, the first set of bitline decoders 406 may be connected to deck 2 and deck 3, and the second set of bitline decoders 408 may be connected to deck 0 and deck 1, although other configurations may be possible.

In some implementations, the memory cells 304 may be accessed via a plurality of wordlines 306 and bitlines 308. For example, each of the memory cells 304 may be located at an intersection of one of wordlines 306 and one of the bitlines 308. In some implementations, activation of a specific pair of wordline and bitline decoders from the sets of decoders 402, 404, 406, and 408 may be used to access one memory cell 304, via the wordlines 306 and the bitlines 308.

Figure 5:
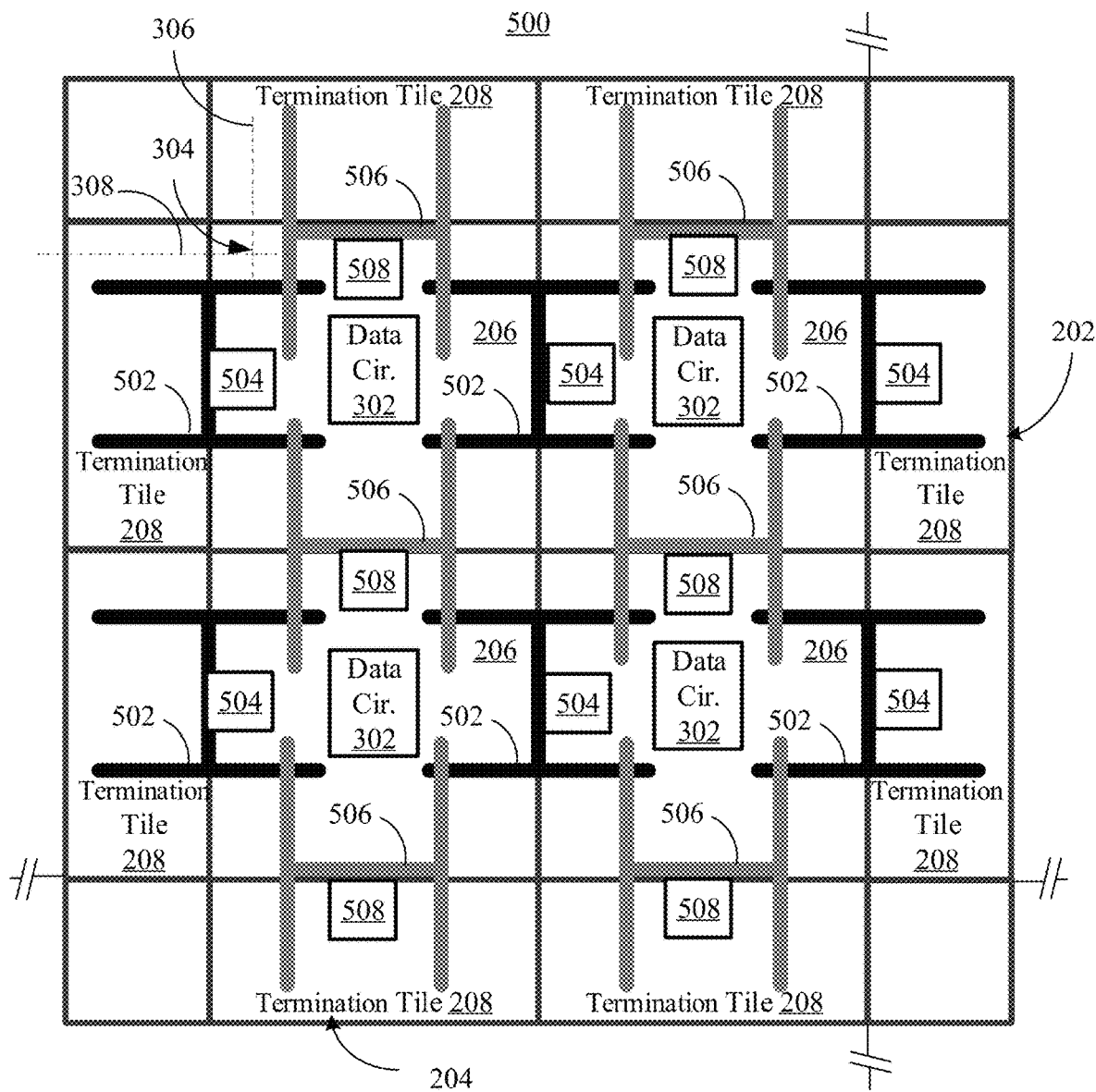
FIG. 5 is a block diagram of an example of a multi-deck non-volatile memory architecture with an improved wordline bus and bitline bus configuration according to an embodiment.

FIG. 5 is a block diagram of an example of an improved wordline bus and bitline bus configuration 500 according to an embodiment. As illustrated, the improved wordline bus and bitline bus configuration 500 may include a plurality of wordline busses 502 coupled to corresponding wordline drivers 504. Similarly, the improved wordline bus and bitline bus configuration 500 may include a plurality of bitline busses 506 coupled to corresponding bitline drivers 508.

In some implementations, at least some of the wordline busses 502 may be located over one of the termination tiles 208 (e.g., one of the termination tiles 208 located at one end of one of the memory tile rows 202) and located over at least a portion of one of the memory tiles 206. Similarly, at least some of the bitline busses 506 may be located over another one of the termination tiles 208 (e.g., one of the termination tiles 208 located at one end of one of the memory tile columns 204) and located over at least a portion of one of the memory tiles 206.

Additionally or alternatively, at least some of the wordline busses 502 may be located over at least a portion of two adjacent memory tiles 206. Similarly, at least some of the bitline busses 506 may be located over at least a portion of two adjacent memory tiles 206. In such implementations, a single one of the memory tiles 206 may be coupled to at least a portion of two of wordline busses 502 and two of the bitline busses 506.

Figure 4B:
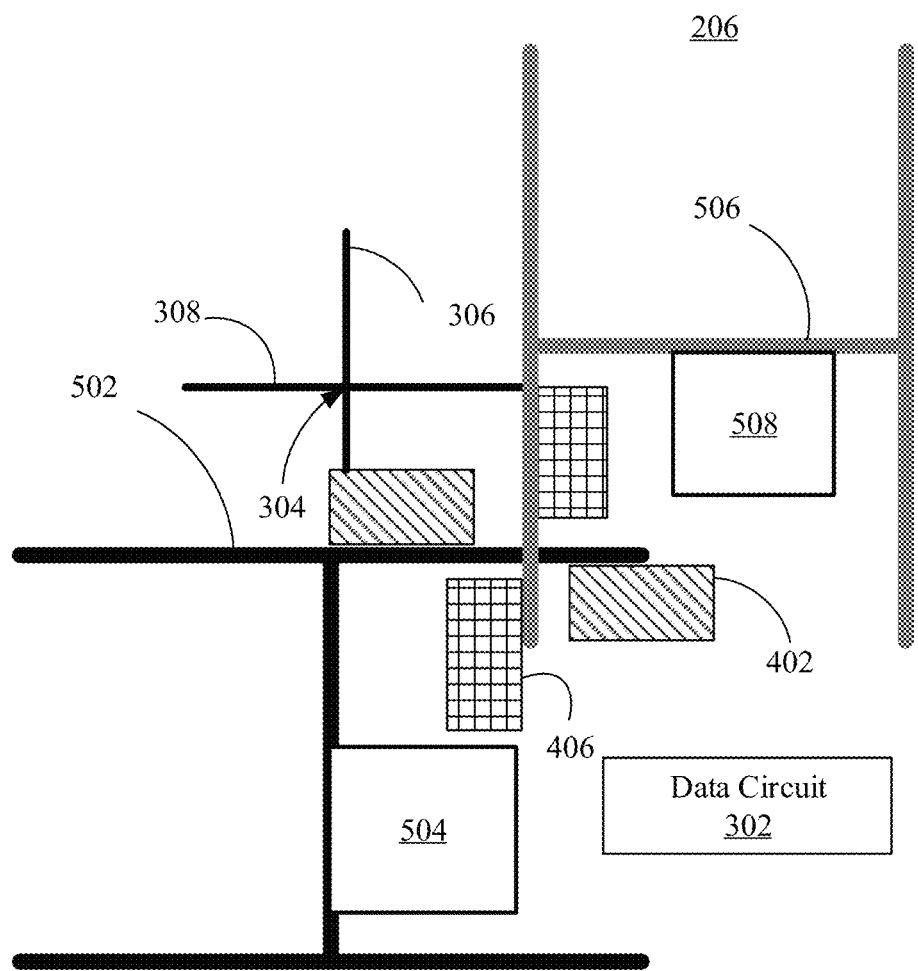
FIG. 4B is still another illustration of an example of a memory tile according to an embodiment.

FIG. 4B is still another illustration of an example of the memory tile 206 according to an embodiment. In the illustrated example, each of the wordline drivers 504 are each associated with a number of the wordline decoders 402. Similarly, each of the bitline drivers 508 are each associated with a number of the bitline decoders 406. In some examples, each of wordline drivers 504 may be coupled to a corresponding one of the wordline busses 502. The wordline bus 502 may be coupled to a group of wordline decoders 402 and may allow the wordline driver 504 to connect to a first group of wordline decoders 402 (e.g., as well as to connect to a second group of wordline decoders 404, as illustrated in FIG. 4A). For example, each of wordline drivers 504 may drive access to at least a portion of the wordlines 306 via the wordline decoder bus 502 and via the wordline decoders 402 (e.g., as well as via a second group of wordline decoders 404, as illustrated in FIG. 4A). Similarly, each of bitline drivers 508 may drive access to at least a portion of the bitlines 308 via the bitline decoder bus 506 and via the bitline decoders 406 (e.g., as well as via a second group of bitline decoders 408, as illustrated in FIG. 4A). In some implementations, the memory cells 304 may be accessed via the wordlines 306 and bitlines 308. For example, each of the memory cells 304 may be located at an intersection of one of wordlines 306 and one of the bitlines 308. In some implementations, activation of a specific pair of wordline and bitline decoders from the sets of decoders 402 and 406 may be used to access one memory cell 304, via the wordlines 306 and the bitlines 308.

Referring back to FIG. 5, each of the wordline drivers 504 may be each associated with an identical number of the wordline decoders even when comparing one of the wordline drivers located over two adjacent memory tiles 206 to a different one of the wordline drivers located over one of the termination tiles 208 and one of the memory tiles 206. However, in some implementations there may not always be an identical number of decoders cells when comparing one of the wordline drivers located over two adjacent memory tiles 206 to a different one of the wordline drivers located over one of the termination tiles 208 and one of the memory tiles 206.

As will be described in more detail below, each of the wordline busses 502 may be coupled to one of the data circuits 302 at a time. Similarly, each of the bitline busses 506 may be coupled to one the data circuits 302 at a time. For example, each of the data circuits 302 may write and read the data state only via a set busses limited to an adjacent set of two of the wordline buses 502 and two of the bitline busses 506.

Figure 6A:
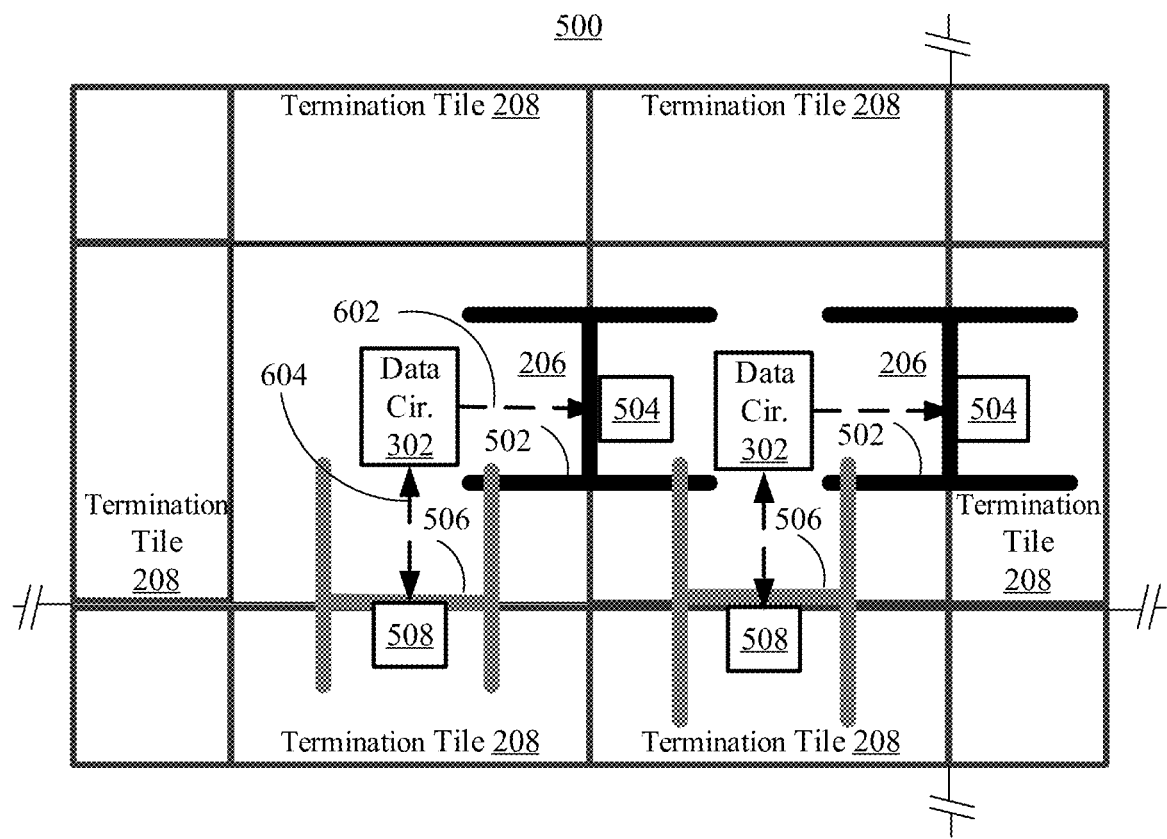
FIGS. 6A-6E are block diagrams illustrating various shifting directions utilized with the improved wordline bus and bitline bus configuration of FIG. 5, according to an embodiment.

FIGS. 6A-6E are block diagrams illustrating various shifting directions utilized with the improved wordline bus and bitline bus configuration 500 of FIG. 5, according to an embodiment. As illustrated, the improved wordline bus and bitline bus configuration 500 may be operated so that several data shifting directions may be utilized to toggle the wordline drivers 504 and the bitline drivers 508 in a partition. As illustrated in FIG. 6A, each of the wordline busses 502 may be coupled to one of the data circuits 302 at a time. Similarly, each of the bitline busses 506 may be coupled to one of the data circuits 302 at a time. For example, each of the data circuits 302 may write data (illustrated by arrow 602) and read the data state (illustrated by arrow 604) only via a set busses limited to an adjacent set of two of the wordline buses 502 and two of the bitline busses 506. In some implementations, such data shifting may be accomplished via data shifting circuitry incorporated within the data circuits 302. Alternatively, such data shifting may be accomplished via data shifting circuitry coupled to the data circuits 302.

Figure 6B:
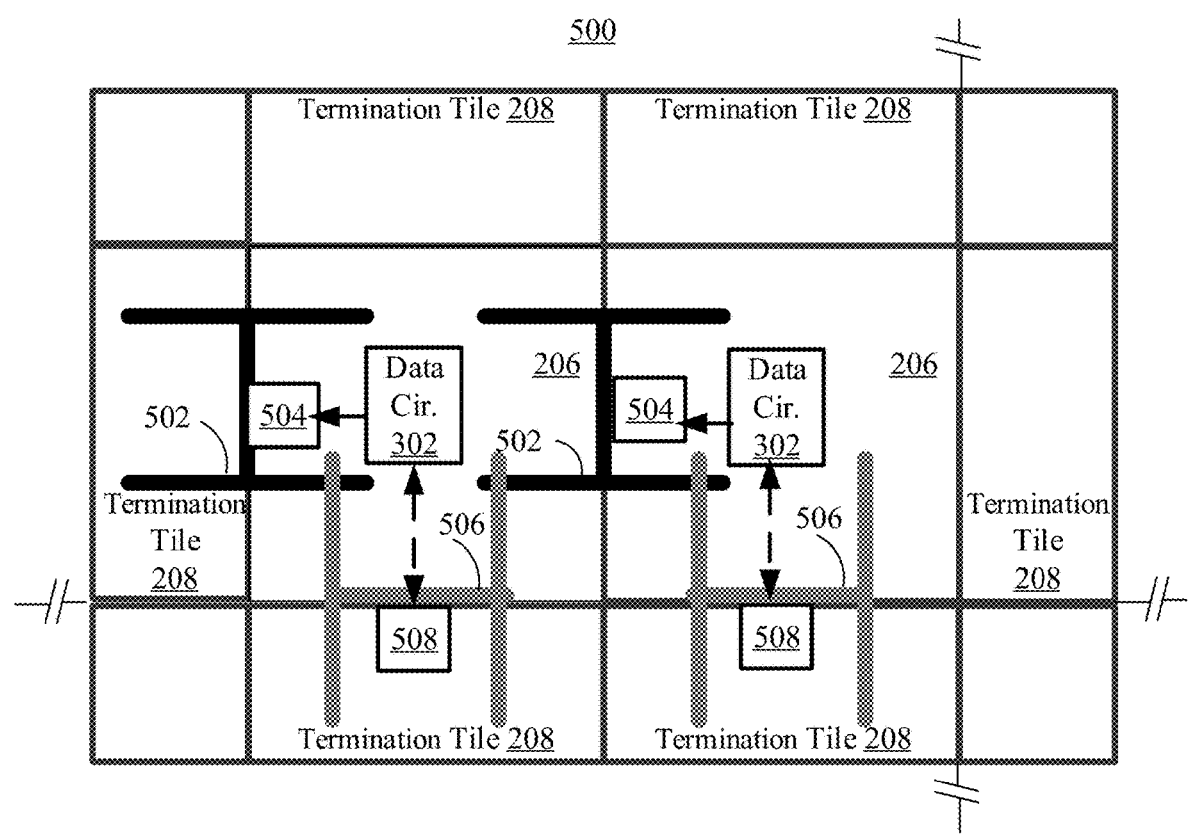
Figure 6C:
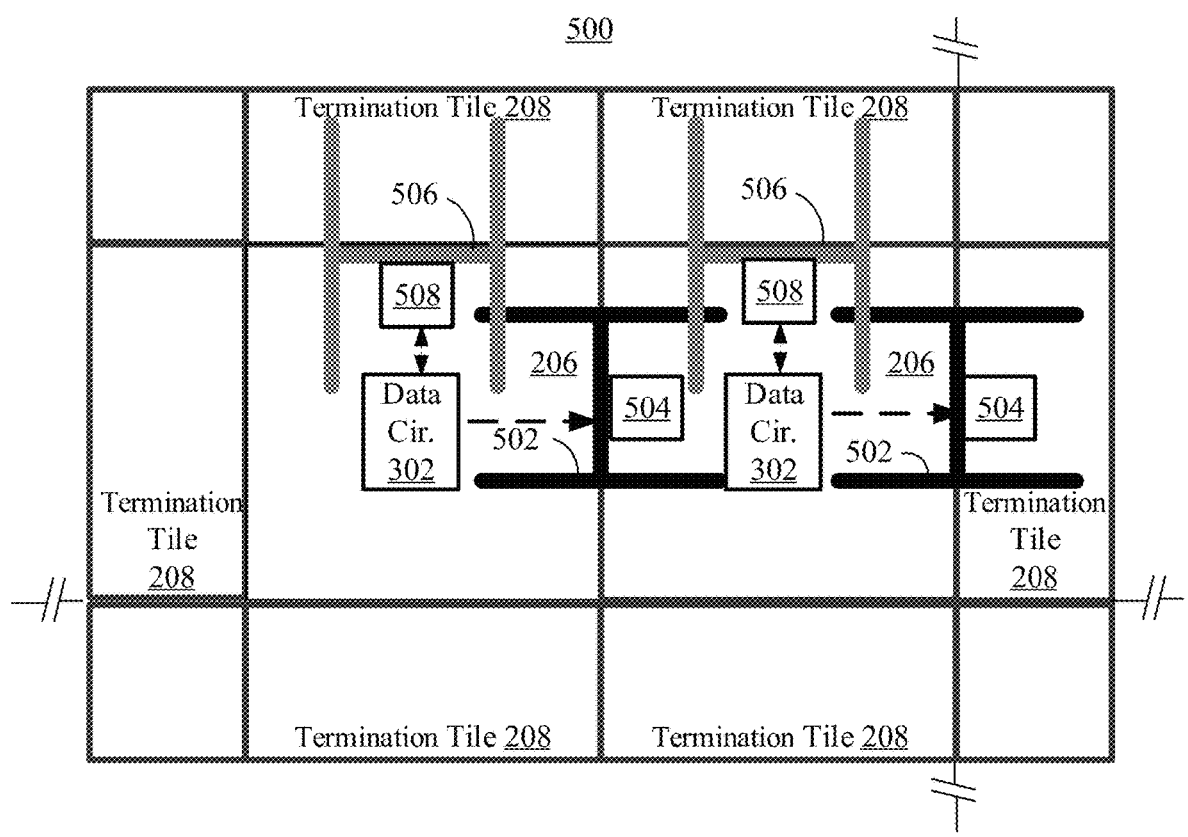
Figure 6D:
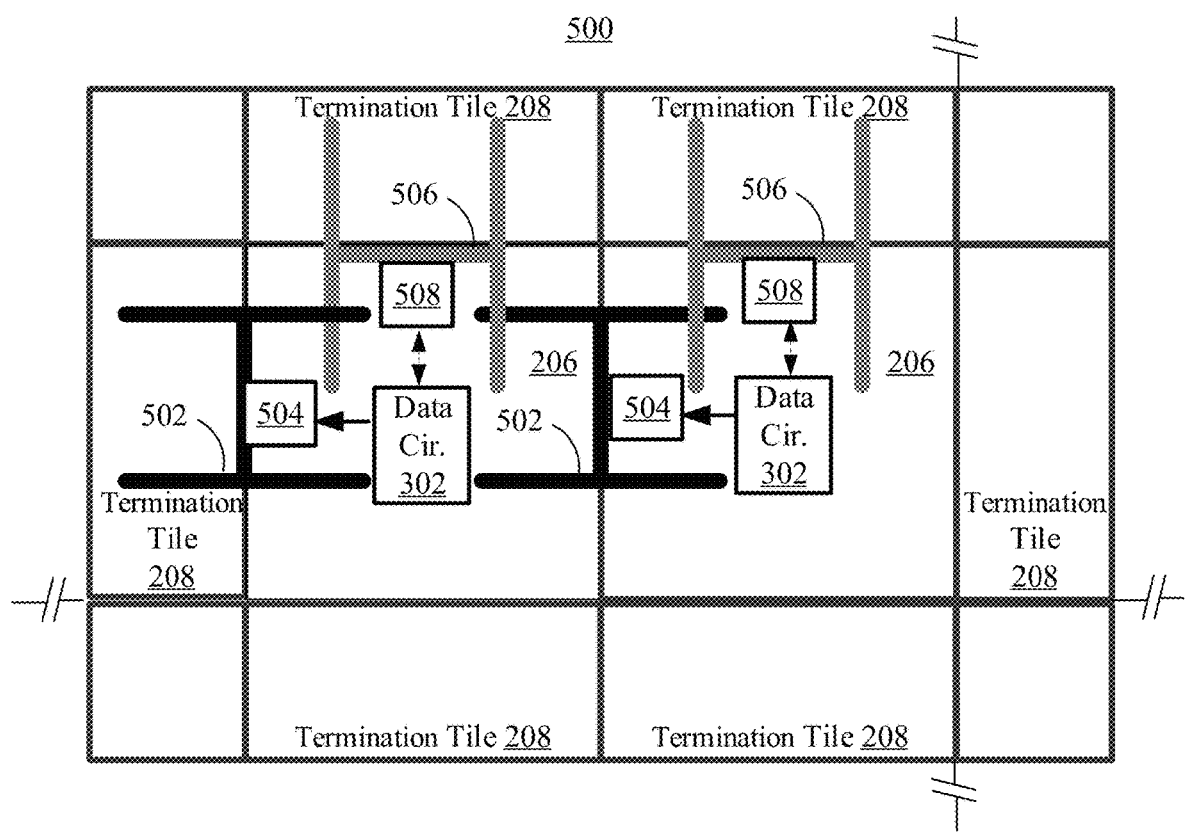

As illustrated, the improved wordline bus and bitline bus configuration 500 may be operated with no directional shift as illustrated in FIG. 6A, a first directional shift (e.g., a left shift) as illustrated in FIG. 6B, a second directional shift that is orthogonal to the first directional shift (e.g., an up shift) as illustrated in FIG. 6C, and a third directional shift that is diagonal to the first and second directional shifts (e.g., a diagonal shift) as illustrated in FIG. 6D.

Figure 6E:
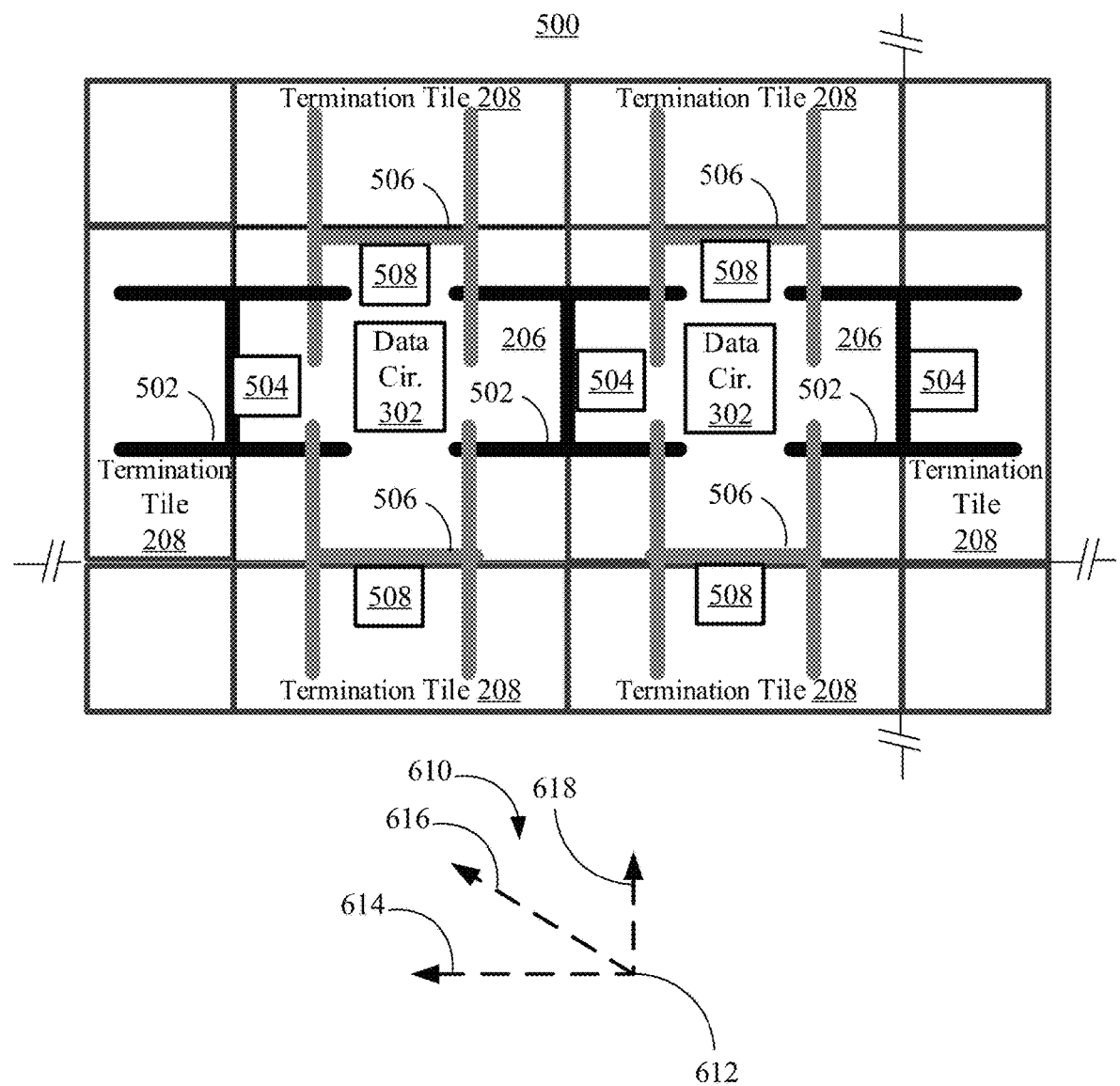

As summarized in FIG. 6E, the improved wordline bus and bitline bus configuration 500 may be operated with 4 different shifting cases 610 (e.g., a no directional shift 612, a first directional shift 614, a second directional shift 618 that is orthogonal to the first directional shift 614, and a third directional shift 616 that is diagonal to the first directional shift 614 and second directional shift 618). In some implementations, the data shifting directions may be limited to 4 different shifting cases (e.g., a no directional shift, a first directional shift, a second directional shift that is orthogonal to the first directional shift, and a third directional shift that is diagonal to the first and second directional shifts). As will be described in greater detail below, such a limited number of the data shifting directions may reduce the amount of logic circuitry in a partition.

Figure 7:
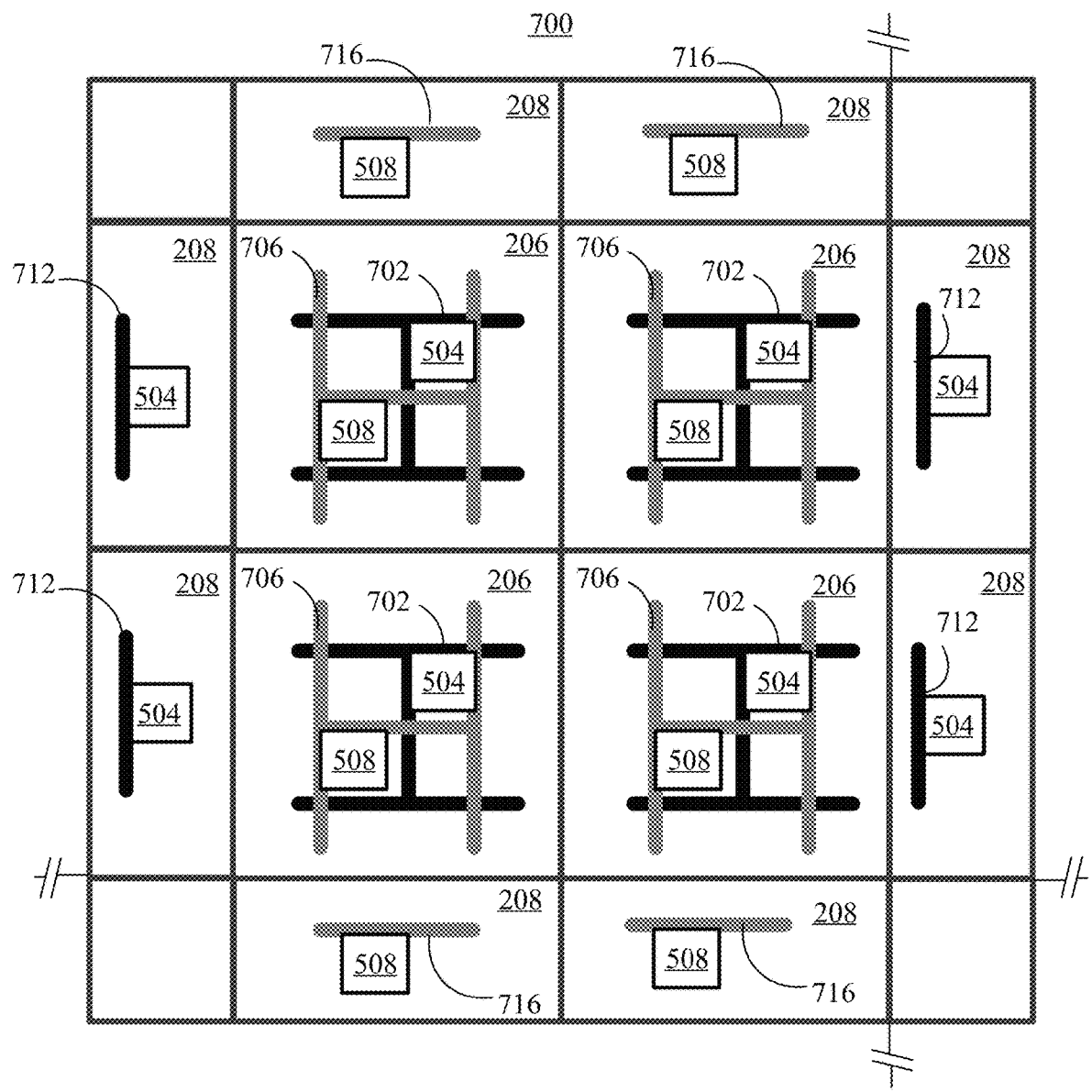
FIG. 7 is a block diagram of an example of a multi-deck non-volatile memory architecture with a typical wordline bus and bitline bus configuration.

FIG. 7 is a block diagram of an example of a typical wordline bus and bitline bus configuration 700. As illustrated, the typical wordline bus and bitline bus configuration 700 includes wordline busses 702 and bitline busses 706 co-located within each individual memory tile 206. Additionally, the typical wordline bus and bitline bus configuration 700 includes special termination wordline busses 712 located within each row end termination tile 208. Similarly, the typical wordline bus and bitline bus configuration 700 includes special termination bitline busses 716 located within each column end termination tile 208.

Advantageously, some implementations herein may reduce the amount of circuitry used in a partition, as compared with the typical wordline bus and bitline bus configuration 700. For example, some implementations herein may reduce the amount of circuitry used in a partition by reducing the number of driver circuits (e.g., wordline driver circuits 504 and bitline driver circuits 508) in a partition. Advantageously, one row and one column of driver circuitry can be eliminated with some of the implementations described herein. For example, in the implementation of FIG. 5, in a 2×2 tile configuration, there are six wordline driver circuits 504 and six bitline driver circuits 508, while in the typical wordline bus and bitline bus configuration 700 of FIG. 7, there are eight wordline driver circuits 504 and eight bitline driver circuits 508. In a 128 tile partition (e.g., for an 8 tile by 16 tile partition), some implementations herein may reduce the number of bitline driver circuits from 160 to 144 and the number of wordline driver circuits from 144 to 136. Accordingly, in such a 128 tile partition example, some implementations herein may advantageously make the die size approximately 1.8% smaller as compared to typical implementations.

Figure 8:
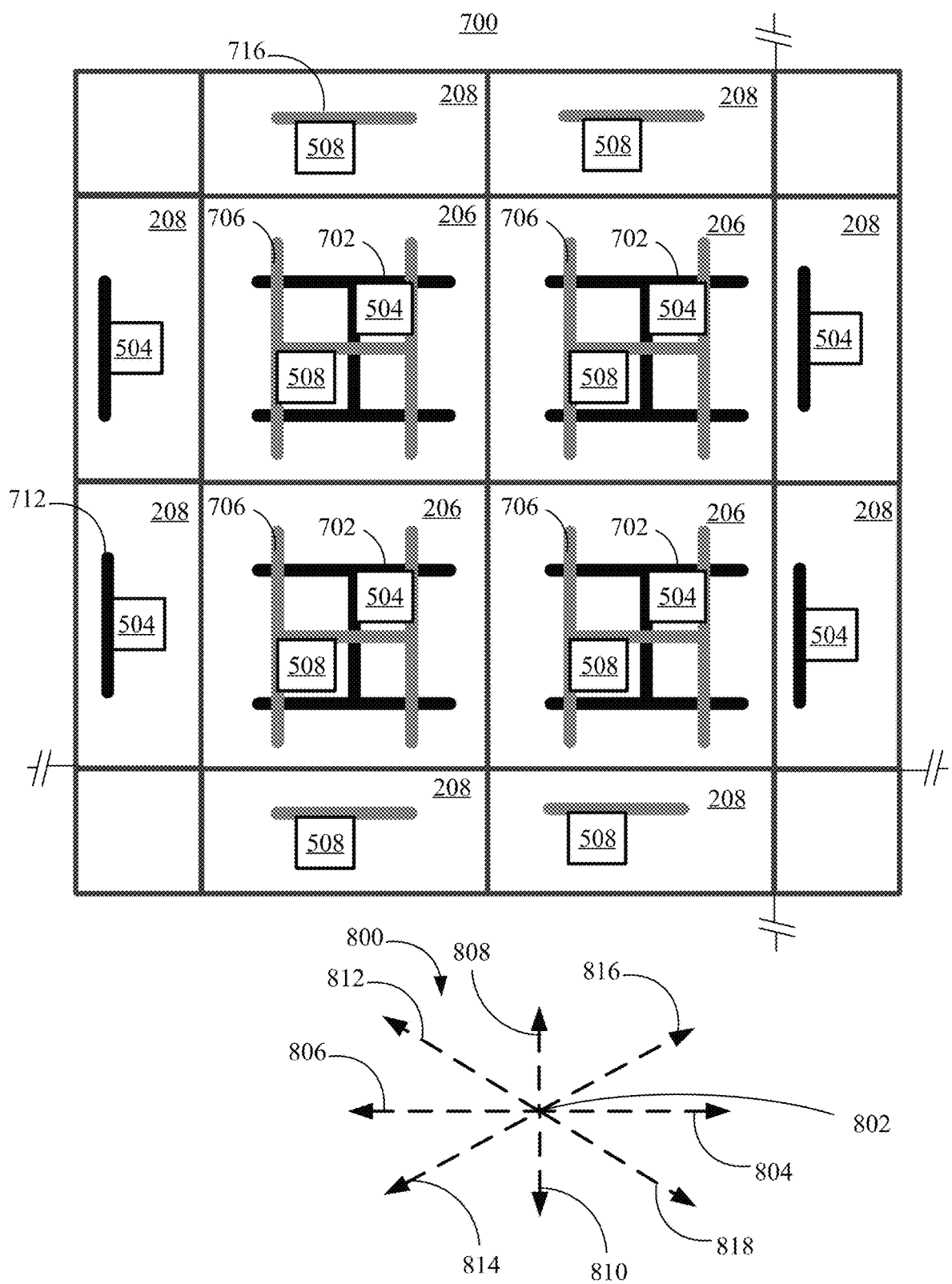
FIG. 8 is a block diagram illustrating various shifting directions utilized with the typical wordline bus and bitline bus configuration of FIG. 7.

FIG. 8 is a block diagram illustrating various shifting directions utilized with the typical wordline bus and bitline bus configuration 700 of FIG. 7. As illustrated, the typical wordline bus and bitline bus configuration 700 may be operated with 9 different shifting cases 800 (e.g., a no shift 802, a right shift 804, a left shift 806, an up shift 808, a down shift 810, a diagonal left and up shift 812, a diagonal left and down shift 814, a diagonal right and up shift 816, and a diagonal right and down shift 818).

Referring back to FIGS. 6A-6E, advantageously, some implementations herein may simplify data shifting circuitry in a partition. FIGS. 6A-6E shows one illustration of how such data shifting circuitry may connect the data circuit 302 to the wordline drivers 504 and bitline drivers 508. As discussed above, in some implementations, such data shifting may be accomplished via data shifting circuitry incorporated within the data circuits 302. Alternatively, such data shifting may be accomplished via data shifting circuitry coupled to the data circuits 302. For example, the data circuitry 302 may be located inside each memory tile 206 and may supply the write data to the wordline drivers 504 and bitline drivers 508 and get the read data from the bitline drivers 508. Since some of the wordline decoders and/or bitline decoders (see, e.g., wordline decoders 402 and 404 and bitline decoders 406 and 408, as discussed above in FIG.

4A) that are selected can be in termination tiles 208, the data circuitry 302 may need to be able to shift two data paths to supply/receive data from the selected decoder cells in termination tiles 208. Some implementations herein may simplify the data shifting circuitry from having 9 different shifting cases (e.g., a no shift, a right shift, a left shift, an up shift, a down shift, a diagonal left and up shift, a diagonal left and down shift, a diagonal right and up shift, and a diagonal right and down shift) to only having 4 shifting cases (e.g., no directional shift, a first directional shift, a second directional shift that is orthogonal to the first directional shift, and a third directional shift that is diagonal to the first and second directional shifts). Accordingly, in such a 4 shifting case example, some implementations herein may advantageously reduce the die size and simplify some of the control logic as compared to typical implementations.

Advantageously, instead of adding a wordline bus 502 to both the left and right termination tiles 208 for each partition row and requiring the partition to shift both left and right, some implementations herein may change the wordline bus 502 distribution to only add one wordline bus 502 per partition row for the termination tiles 208. In such an example, some implementations herein may require the partition to only shift one direction (e.g., left) instead of shifting in two directions (e.g., both left and right). For a 128 tile partition (e.g., for an 8 tile by 16 tile partition), some implementations herein may eliminate 8 wordline driver circuits 504 per partition. Likewise, instead of adding a bitline bus 506 to both the top and bottom termination tiles 208 for each partition column and requiring the partition to shift in two directions (e.g., both up and down), some implementations herein may change the bitline bus 506 distribution to only add one bitline bus 506 per partition column for the termination tiles 208 and require the partition to only shift one direction (e.g., up). For a 128 tile partition (e.g., for an 8 tile by 16 tile partition), some implementations herein may eliminate 16 bitline driver circuits 508 per partition. Both the wordline driver circuits 504 and bitline driver circuits 508 are very large circuits, so the elimination of 8 wordline driver circuits 504 per partition and 16 bitline driver circuits 508 per partition may advantageously reduce the die size. Additionally, reducing the die size may also advantageously lower the cost of the device.

Figure 9:
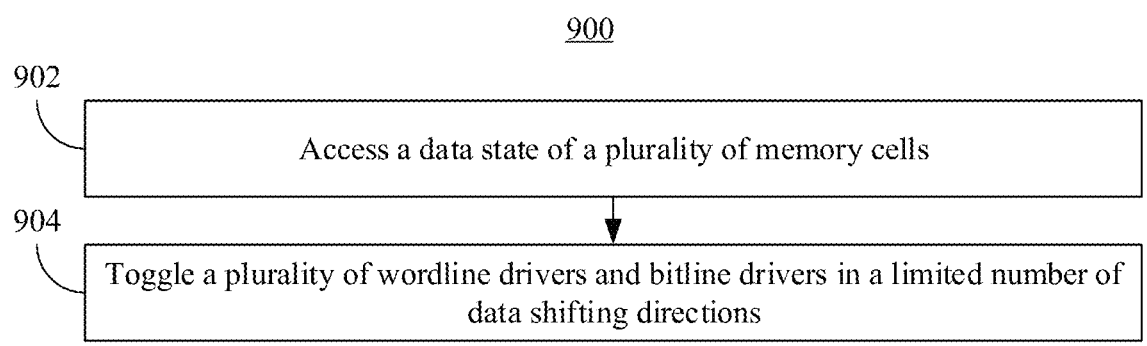
FIG. 9 is a flowchart of an example of a method of operating a memory device according to an embodiment.

FIG. 9 shows a method 900 of operating a memory device. The method 900 may generally be implemented in a three-dimensional memory device, such as, for example, the multi-deck non-volatile memory architecture with an improved wordline bus and bitline bus configuration (FIG. 5), already discussed. More particularly, the method 900 may be implemented in one or more modules as a set of logic instructions stored in a machine- or computer-readable storage medium such as random access memory (RAM), ROM, programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 900 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 902 may provide for accessing the data state of a plurality of memory cells. For example, block 902 may provide for accessing the data state to one of a plurality of memory cells in a memory tile via a data circuit.

Illustrated processing block 904 may provide for toggling a plurality of wordline drivers and a plurality of bitline drivers. For example, processing block 904 may provide for toggling a plurality of wordline drivers and a plurality of bitline drivers in a partition of a plurality of memory tiles in a plurality data shifting directions. In such an example, processing block 904 may perform such toggling to select which one of the plurality of wordline drivers and the plurality of bitline drivers are in communication with the data circuit. For example, the plurality of data shifting directions may include only a no directional shift, a first directional shift, a second directional shift that is orthogonal to the first directional shift, and a third directional shift that is diagonal to the first and second directional shifts.

In some implementations of method 900 the data circuit may access the data state via a plurality of drivers. In such implementations the plurality of drivers may only include a first wordline driver and a second wordline driver of the plurality of wordline drivers and a first bitline driver and a second bitline driver of the plurality of bitline drivers.

Figure 10:
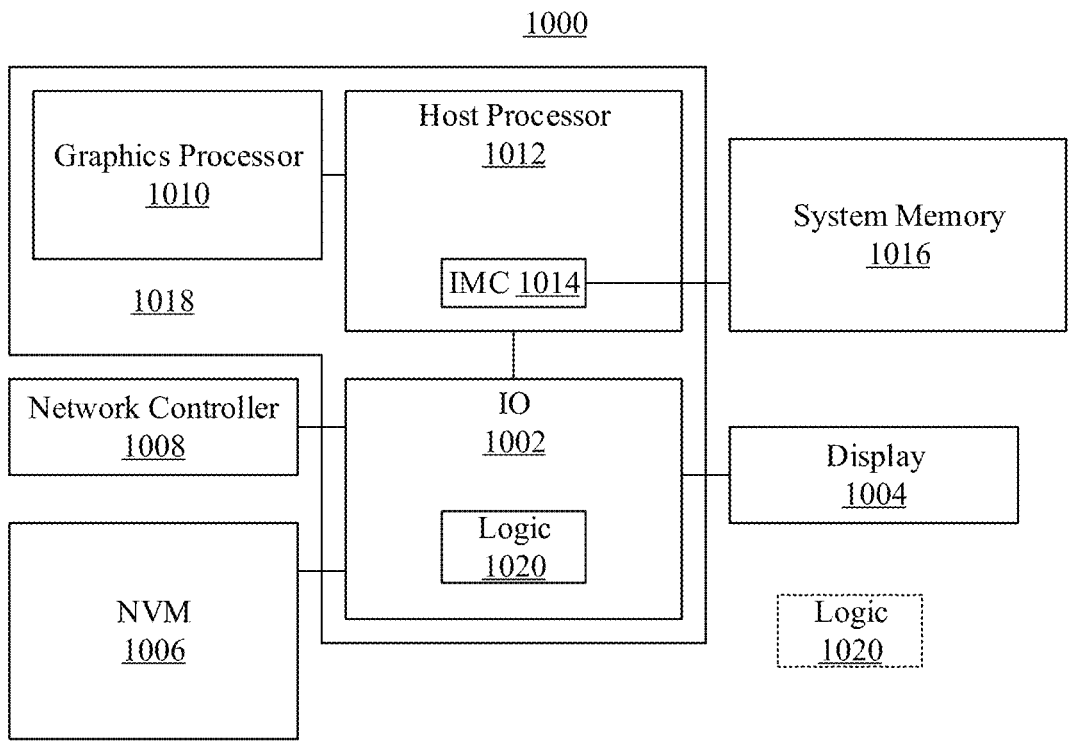
FIG. 10 is a block diagram of an example of a performance-enhanced computing system according to an embodiment.

FIG. 10 shows a performance-enhanced computing system 1000. The system 1000 may generally implement one or more aspects of the method 900 (FIG. 9), already discussed. More particularly, the system 1000 may be part of a server, desktop computer, notebook computer, tablet computer, convertible tablet, smart television (TV), personal digital assistant (PDA), mobile Internet device (MID), smart phone, wearable device, media player, vehicle, robot, etc., or any combination thereof. In the illustrated example, an input/output (IO) module 1002 is communicatively coupled to a display 1004 (e.g., liquid crystal display/LCD, light emitting diode/LED display, touch screen), NVM 1006 (e.g., NAND flash memory) and a network controller 1008 (e.g., wired, wireless).

The system 1000 may also include a graphics processor 1010 and a host processor 1012 (e.g., central processing unit/CPU) that includes an integrated memory controller (IMC) 1014, wherein the illustrated IMC 1014 communicates with a system memory 1016 over a bus or other suitable communication interface. The host processor 1012, the graphics processor 1010 and the IO module 1002 are integrated onto a shared semiconductor die 1018 in a system on chip (SoC) architecture.

The illustrated IO module 1002 includes logic 1020 (e.g., a memory controller including logic instructions, configurable logic, fixed-functionality hardware logic, etc., or any combination thereof) to implement one or more aspects of the method 900 (FIG. 9), already discussed. Thus, the logic 1020 may access a data state of a plurality of memory cells 304. The logic 1020 may also provide for toggling a plurality of wordline drivers and a plurality of bitline drivers. For example, logic 1020 may provide for toggling a plurality of wordline drivers and a plurality of bitline drivers in a partition of a plurality of memory tiles in a plurality data shifting directions. For example, the plurality of data shifting directions may include only a no directional shift, a first directional shift, a second directional shift that is orthogonal to the first directional shift, and a third directional shift that is diagonal to the first and second directional shifts.

The illustrated system 1000 may be considered to be performance-enhanced to the extent that it may reduce the amount of circuitry used in a partition. For example, some implementations herein may reduce the amount of circuitry used in a partition by allowing driver circuitry (e.g., wordline driver circuitry and bitline driver circuitry) to be shifted from a memory tile into a termination tile of a partition. Additionally or alternatively, the illustrated system 1000 may be considered to be performance-enhanced to the extent that it may simplify data shifting circuitry in a partition. For example, some implementations herein may the data simplify the data shifting circuitry from having 9 different shifting cases (e.g., a no shift, a right shift, a left shift, an up shift, a down shift, and four different diagonal shifts) to only having 4 shifting cases (e.g., no directional shift, a first directional shift, a second directional shift that is orthogonal to the first directional shift, and a third directional shift that is diagonal to the first and second directional shifts).

In an embodiment, the NVM 1006 is mass storage containing a memory structure that may include non-volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of wordlines and bitlines and are individually addressable and in which bit storage is based on a change in bulk resistance. In particular embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

Figure 11:
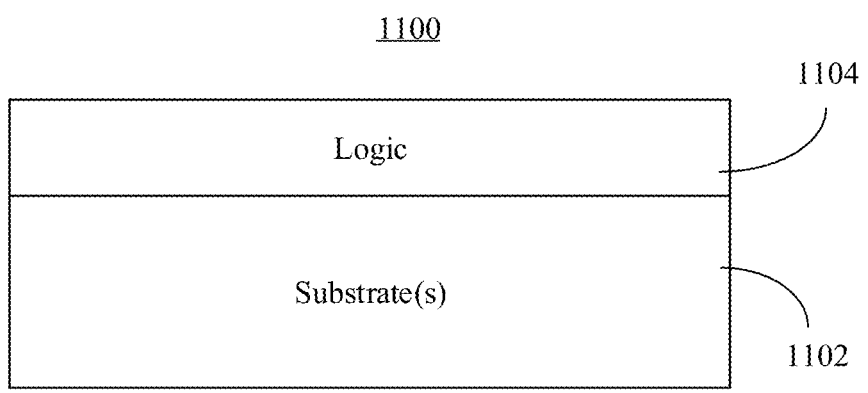
FIG. 11 is an illustration of an example of a semiconductor package apparatus according to an embodiment.

FIG. 11 shows a semiconductor apparatus 1100 (e.g., chip, die) that includes one or more substrates 1102 (e.g., silicon, sapphire, gallium arsenide) and logic 1104 (e.g., a memory controller including transistor array and other integrated circuit/IC components) coupled to the substrate(s) 1102. The logic 1104, which may be implemented at least partly in configurable logic and/or fixed-functionality hardware logic, may generally implement one or more aspects of the method 900 (FIG. 9).

Thus, the logic 1104 may access the data state of a plurality of memory cells. For example, the logic 1104 may provide for accessing a data state of a plurality of memory cells in a memory tile via a data circuit. The logic 1104 may also provide for toggling a plurality of wordline drivers and a plurality of bitline drivers. For example, the logic 1104 may provide for toggling a plurality of wordline drivers and a plurality of bitline drivers in a partition of a plurality of memory tiles in a plurality data shifting directions. In such an example, the logic 1104 may provide performing such toggling to select which one of the plurality of wordline drivers and the plurality of bitline drivers are in communication with the data circuit. For example, the plurality of data shifting directions may include only a no directional shift, a first directional shift, a second directional shift that is orthogonal to the first directional shift, and a third directional shift that is diagonal to the first and second directional shifts.

The illustrated apparatus 1100 may be considered to be performance-enhanced to the extent that it may reduce the amount of circuitry used in a partition. For example, some implementations herein may reduce the amount of circuitry used in a partition by reducing the number of driver circuits in a partition. Additionally or alternatively, the illustrated apparatus 1100 may be considered to be performance-enhanced to the extent that it may simplify data shifting circuitry in a partition. For example, some implementations herein may simplify data shifting circuitry from having 9 different shifting cases (e.g., a no shift, a right shift, a left shift, an up shift, a down shift, and four different diagonal shifts) to only having 4 shifting cases (e.g., no directional shift, a first directional shift, a second directional shift that is orthogonal to the first directional shift, and a third directional shift that is diagonal to the first and second directional shifts).

In one example, the logic 1104 includes transistor channel regions that are positioned (e.g., embedded) within the substrate(s) 1102. Thus, the interface between the logic 1104 and the substrate(s) 1102 may not be an abrupt junction. The logic 1104 may also be considered to include an epitaxial layer that is grown on an initial wafer of the substrate(s) 1102.

Additional Notes and Examples

Example 1 includes a semiconductor apparatus comprising one or more substrates; and a plurality of decks of a multi-deck non-volatile memory coupled to the one or more substrates. At least one of the plurality of decks comprising a partition including a plurality of memory tile rows, a plurality of memory tile columns, and a memory tile, wherein the memory tile includes a data circuit coupled to a plurality of memory cells, wherein the data circuit is to access a data state of a plurality of memory cells; a first termination tile located at one end of one of the plurality of memory tile rows; and a first wordline bus coupled to the data circuit, wherein the first wordline bus is located over the first termination tile and at least a portion of the memory tile.

Example 2 includes the semiconductor apparatus of Example 1, wherein the at least one of the plurality of decks further comprises a second termination tile located at one end of one of the plurality of memory tile columns, and a first bitline bus coupled to the data circuit, wherein the first bitline bus is located over the second termination tile and at least a portion of the memory tile.

Example 3 includes the semiconductor apparatus of Example 2, wherein the at least one of the plurality of decks further comprises a first wordline driver to drive access to at least a portion of the plurality of wordlines, wherein the first wordline driver is coupled to the first wordline bus, and a first bitline driver to drive access to at least a portion of the plurality of bitlines, wherein the first bitline driver is coupled to the first bitline bus, wherein a plurality of data shifting directions are utilized to toggle a plurality of the wordline drivers and a plurality of the bitline drivers in the partition, and wherein the plurality of data shifting directions consist of a no directional shift, a first directional shift, a second directional shift that is orthogonal to the first directional shift, and a third directional shift that is diagonal to the first and second directional shifts.

Example 4 includes the semiconductor apparatus of Example 2, wherein the at least one of the plurality of decks further comprises a first bitline driver to drive access to at least a portion of the plurality of bitlines, wherein the first bitline driver is coupled to the first bitline bus, and a second bitline bus coupled to a second bitline driver and the data circuit, wherein the second bitline bus is located over the memory tile and at least a portion of a second memory tile, wherein the first and second bitline drivers are to drive access to the plurality of bitlines via a plurality of bitline decoders, wherein the first and second bitline drivers are each associated with an identical number of the bitline decoders.

Example 5 includes the semiconductor apparatus of Example 1, wherein the at least one of the plurality of decks further comprises: a first wordline driver to drive access to at least a portion of the plurality of wordlines, wherein the first wordline driver is coupled to the first wordline bus, a second wordline bus coupled to a second wordline driver and the data circuit, wherein the second wordline bus is located over the memory tile and at least a portion of a second memory tile, wherein the first and second wordline drivers are to drive access to the plurality of wordlines via a plurality of wordline decoders.

Example 6 includes the semiconductor apparatus of Example 1, wherein the at least one of the plurality of decks further comprises: a first wordline driver to drive access to at least a portion of the plurality of wordlines, wherein the first wordline driver is coupled to the first wordline bus, and a first bitline driver to drive access to at least a portion of the plurality of bitlines, wherein the first bitline driver is coupled to the first bitline bus, wherein one hundred and twenty eight of the tiles in the partition are associated with a plurality of the wordline drivers consisting of one hundred and thirty-six of the wordline drivers and a plurality of the bitline drivers consisting of one hundred and forty-four of the bitline drivers.

Example 7 includes the semiconductor apparatus of Example 1, wherein the memory tile is coupled to the first wordline bus, a second wordline bus, a first bitline bus, and a second bitline bus.

Example 8 includes the semiconductor apparatus of Example 1, wherein the data circuit is to access the data state via a plurality of busses, wherein the plurality of busses consist of the first wordline bus, a second wordline bus, a first bitline bus, and a second bitline bus.

Example 9 includes the semiconductor apparatus of Example 1, wherein one or more of the plurality of decks comprises a crosspoint array of non-volatile memory cells, wherein each of the plurality of memory cells comprise a material capable of being in two or more stable states to store a logic value, wherein the plurality of memory cells are accessed via a plurality of wordlines and bitlines, and wherein each memory cell of the plurality of memory cells is located at an intersection of one of the plurality of wordlines and one of the plurality of bitlines.

Example 10 includes a system comprising a memory controller; and a multi-deck non-volatile memory structure coupled to the memory controller. The multi-deck non-volatile memory structure comprising a plurality of decks, at least one of the plurality of decks comprising a partition comprising a plurality of memory tile rows, a plurality of memory tile columns, and a memory tile, wherein the memory tile includes a data circuit coupled to a plurality of memory cells, and wherein the data circuit is to access a data state of a plurality of memory cells, a first termination tile located at one end of one of the plurality of memory tile rows, and a first wordline bus coupled to the data circuit, wherein the first wordline bus is located over the first termination tile and at least a portion of the memory tile.

Example 11 includes the system of Example 10, the at least one of the plurality of decks further comprising a second termination tile located at one end of one of the plurality of memory tile columns, and a first bitline bus coupled to the data circuit, wherein the first bitline bus is located over the second termination tile and at least a portion of the memory tile.

Example 12 includes the system of Example 11, wherein the at least one of the plurality of decks further comprises: a first wordline driver to drive access to at least a portion of the plurality of wordlines, wherein the first wordline driver is coupled to the first wordline bus, and a first bitline driver to drive access to at least a portion of the plurality of bitlines, wherein the first bitline driver is coupled to the first bitline bus, wherein a plurality data shifting directions are utilized to toggle a plurality of the wordline drivers and a plurality of the bitline drivers in the partition, wherein the plurality of data shifting directions consist of a no directional shift, a first directional shift, a second directional shift that is orthogonal to the first directional shift, and a third directional shift that is diagonal to the first and second directional shifts.

Example 13 includes the system of Example 11, wherein the at least one of the plurality of decks further comprises a first bitline driver to drive access to at least a portion of the plurality of bitlines, wherein the first bitline driver is coupled to the first bitline bus, and a second bitline bus coupled to a second bitline driver and the data circuit, wherein the second bitline bus is located over the memory tile and at least a portion of a second memory tile, wherein the first and second bitline drivers are to drive access to the plurality of bitlines via a plurality of bitline decoders.

Example 14 includes the system of Example 10, wherein the at least one of the plurality of decks further comprises a first wordline driver to drive access to at least a portion of the plurality of wordlines, wherein the first wordline driver is coupled to the first wordline bus, and a second wordline bus coupled to a second wordline driver and the data circuit, wherein the second wordline bus is located over the memory tile and at least a portion of a second memory tile, wherein the first and second wordline drivers are to drive access to the plurality of wordlines via a plurality of wordline decoders, wherein the first and second wordline drivers are each associated with an identical number of the wordline decoders.

Example 15 includes the system of Example 10, wherein the at least one of the plurality of decks further comprises a first wordline driver to drive access to at least a portion of the plurality of wordlines, wherein the first wordline driver is coupled to the first wordline bus, and a first bitline driver to drive access to at least a portion of the plurality of bitlines, wherein the first bitline driver is coupled to the first bitline bus, wherein one hundred and twenty eight of the tiles in the partition are associated with a plurality of the wordline drivers consisting of one hundred and thirty-six of the wordline drivers and a plurality of the bitline drivers consisting of one hundred and forty-four of the bitline drivers.

Example 16 includes the system of Example 10, wherein the memory tile is coupled to the first wordline bus, a second wordline bus, a first bitline bus, and a second bitline bus.

Example 17 includes the system of Example 10, wherein the data circuit is to access the data state via a plurality of busses, wherein the plurality of busses consist of the first wordline bus, a second wordline bus, a first bitline bus, and a second bitline bus.

Example 18 includes the system of Example 1, wherein one or more of the plurality of decks comprises a crosspoint array of non-volatile memory cells, wherein each of the plurality of memory cells comprise a material capable of being in two or more stable states to store a logic value, wherein the plurality of memory cells are accessed via a plurality of wordlines and bitlines, and wherein each memory cell of the plurality of memory cells is located at an intersection of one of the plurality of wordlines and one of the plurality of bitlines.

Example 19 includes a method comprising accessing a data state of a plurality of memory cells in a memory tile via a data circuit; and toggling a plurality of wordline drivers and a plurality of bitline drivers in a partition of a plurality of memory tiles in a plurality data shifting directions to select which one of the plurality of wordline drivers and the plurality of bitline drivers are in communication with the data circuit, wherein the plurality of data shifting directions consist of a no directional shift, a first directional shift, a second directional shift that is orthogonal to the first directional shift, and a third directional shift that is diagonal to the first and second directional shifts.

Example 20 includes the method of Example 19, wherein the data circuit is to access the data state via a plurality of drivers, wherein the plurality of drivers consist of a first wordline driver and a second wordline driver of the plurality of wordline drivers and via a first bitline driver and a second bitline driver of the plurality of bitline drivers.

Example 21 may include means for performing the functions as described in any preceding Example.

Example 22 may include machine-readable storage including machine-readable instructions which, when executed, implement a method or realize an apparatus as described in any preceding Example.

Technology described herein may therefore provide a substantial enhancement to the extent that it may reduce the amount of circuitry used in a partition. For example, some implementations herein may reduce the amount of circuitry used in a partition and allow additional circuitry outside of the partition to be moved into the partition reducing die size. Additionally or alternatively, technology described herein may therefore provide a substantial enhancement to the extent that it may simplify data shifting circuitry in a partition. For example, some implementations herein may simplify the data shifting circuitry from having 9 different shifting cases (e.g., a no shift, a right shift, a left shift, an up shift, a down shift, and four different diagonal shifts) to only having 4 shifting cases (e.g., no directional shift, a first directional shift, a second directional shift that is orthogonal to the first directional shift, and a third directional shift that is diagonal to the first and second directional shifts).

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus comprising:
   one or more substrates; and
   a plurality of decks of a multi-deck non-volatile memory coupled to the one or more substrates, at least one of the plurality of decks comprising:
     a partition including a plurality of memory tile rows, a plurality of memory tile columns, and a memory tile, wherein the memory tile includes a data circuit coupled to a plurality of memory cells, wherein the data circuit is to access a data state of a plurality of memory cells,
     a first termination tile located at one end of one of the plurality of memory tile rows,
     a first wordline bus coupled to the data circuit, wherein the first wordline bus is located over the first termination tile and at least a portion of the memory tile, wherein the first wordline bus is coupled to two or more memory cells of the plurality of memory cells of the memory tile that are coupled to the data circuit, and
     a second wordline bus coupled to a second wordline driver and the data circuit, wherein the second wordline bus is coupled to a different two or more memory cells of the plurality of memory cells of the memory tile that are coupled to the data circuit.

2. The semiconductor apparatus of claim 1, wherein the at least one of the plurality of decks further comprises:
   a second termination tile located at one end of one of the plurality of memory tile columns, and
   a first bitline bus coupled to the data circuit, wherein the first bitline bus is located over the second termination tile and at least a portion of the memory tile.

3. The semiconductor apparatus of claim 2, wherein the at least one of the plurality of decks further comprises:
   a first wordline driver to drive access to at least a portion of the plurality of wordlines, wherein the first wordline driver is coupled to the first wordline bus, and
   a first bitline driver to drive access to at least a portion of the plurality of bitlines, wherein the first bitline driver is coupled to the first bitline bus,
   wherein a plurality of data shifting directions are utilized to toggle a plurality of the wordline drivers and a plurality of the bitline drivers in the partition, and wherein the plurality of data shifting directions consist of a no directional shift, a first directional shift, a second directional shift that is orthogonal to the first directional shift, and a third directional shift that is diagonal to the first and second directional shifts.

4. The semiconductor apparatus of claim 2, wherein the at least one of the plurality of decks further comprises:
   a first bitline driver to drive access to at least a portion of the plurality of bitlines, wherein the first bitline driver is coupled to the first bitline bus, and
   a second bitline bus coupled to a second bitline driver and the data circuit,
   wherein the second bitline bus is located over the memory tile and at least a portion of a second memory tile, wherein the first and second bitline drivers are to drive access to the plurality of bitlines via a plurality of bitline decoders, wherein the first and second bitline drivers are each associated with an identical number of the bitline decoders.

5. The semiconductor apparatus of claim 1, wherein the at least one of the plurality of decks further comprises:
   a first wordline driver to drive access to at least a portion of the plurality of wordlines, wherein the first wordline driver is coupled to the first wordline bus, and
   wherein the second wordline bus is located over the memory tile and at least a portion of a second memory tile, wherein the first and second wordline drivers are to drive access to the plurality of wordlines via a plurality of wordline decoders.

6. The semiconductor apparatus of claim 1, wherein the at least one of the plurality of decks further comprises:
   a first wordline driver to drive access to at least a portion of the plurality of wordlines, wherein the first wordline driver is coupled to the first wordline bus, and
   a first bitline driver to drive access to at least a portion of the plurality of bitlines, wherein the first bitline driver is coupled to the first bitline bus,
   wherein one hundred and twenty eight of the tiles in the partition are associated with a plurality of the wordline drivers consisting of one hundred and thirty-six of the wordline drivers and a plurality of the bitline drivers consisting of one hundred and forty-four of the bitline drivers.

7. The semiconductor apparatus of claim 1, wherein the memory tile is coupled to the first wordline bus, a second wordline bus, a first bitline bus, and a second bitline bus.

8. The semiconductor apparatus of claim 1, wherein the data circuit is to access the data state via a plurality of busses, wherein the plurality of busses consist of the first wordline bus, a second wordline bus, a first bitline bus, and a second bitline bus.

9. The semiconductor apparatus of claim 1, wherein one or more of the plurality of decks comprises a crosspoint array of non-volatile memory cells, wherein each of the plurality of memory cells comprise a material capable of being in two or more stable states to store a logic value, wherein the plurality of memory cells are accessed via a plurality of wordlines and bitlines, and wherein each memory cell of the plurality of memory cells is located at an intersection of one of the plurality of wordlines and one of the plurality of bitlines.

10. A system comprising:
    a memory controller; and a multi-deck non-volatile memory structure coupled to the memory controller, the multi-deck non-volatile memory structure comprising a plurality of decks, at least one of the plurality of decks comprising:
- a partition comprising a plurality of memory tile rows, a plurality of memory tile columns, and a memory tile, wherein the memory tile includes a data circuit coupled to a plurality of memory cells, and wherein the data circuit is to access a data state of a plurality of memory cells,
- a first termination tile located at one end of one of the plurality of memory tile rows,
- a first wordline bus coupled to the data circuit, wherein the first wordline bus is located over the first termination tile and at least a portion of the memory tile, wherein the first wordline bus is coupled to two or more memory cells of the plurality of memory cells of the memory tile that are coupled to the data circuit, and
- a second wordline bus coupled to a second wordline driver and the data circuit, wherein the second wordline bus is coupled to a different two or more memory cells of the plurality of memory cells of the memory tile that are coupled to the data circuit.

11. The system of claim 10, the at least one of the plurality of decks further comprising:
- a second termination tile located at one end of one of the plurality of memory tile columns, and
- a first bitline bus coupled to the data circuit, wherein the first bitline bus is located over the second termination tile and at least a portion of the memory tile.

12. The system of claim 11, wherein the at least one of the plurality of decks further comprises:
- a first wordline driver to drive access to at least a portion of the plurality of wordlines, wherein the first wordline driver is coupled to the first wordline bus, and
- a first bitline driver to drive access to at least a portion of the plurality of bitlines, wherein the first bitline driver is coupled to the first bitline bus,
- wherein a plurality data shifting directions are utilized to toggle a plurality of the wordline drivers and a plurality of the bitline drivers in the partition, wherein the plurality of data shifting directions consist of a no directional shift, a first directional shift, a second directional shift that is orthogonal to the first directional shift, and a third directional shift that is diagonal to the first and second directional shifts.

13. The system of claim 11, wherein the at least one of the plurality of decks further comprises:
- a first bitline driver to drive access to at least a portion of the plurality of bitlines, wherein the first bitline driver is coupled to the first bitline bus, and
- a second bitline bus coupled to a second bitline driver and the data circuit,
- wherein the second bitline bus is located over the memory tile and at least a portion of a second memory tile, wherein the first and second bitline drivers are to drive access to the plurality of bitlines via a plurality of bitline decoders.

14. The system of claim 10, wherein the at least one of the plurality of decks further comprises:
- a first wordline driver to drive access to at least a portion of the plurality of wordlines, wherein the first wordline driver is coupled to the first wordline bus, and
- wherein the second wordline bus is located over the memory tile and at least a portion of a second memory tile, wherein the first and second wordline drivers are to drive access to the plurality of wordlines via a plurality of wordline decoders, wherein the first and second wordline drivers are each associated with an identical number of the wordline decoders.

15. The system of claim 10, wherein the at least one of the plurality of decks further comprises:
- a first wordline driver to drive access to at least a portion of the plurality of wordlines, wherein the first wordline driver is coupled to the first wordline bus, and
- a first bitline driver to drive access to at least a portion of the plurality of bitlines, wherein the first bitline driver is coupled to the first bitline bus,
- wherein one hundred and twenty eight of the tiles in the partition are associated with a plurality of the wordline drivers consisting of one hundred and thirty-six of the wordline drivers and a plurality of the bitline drivers consisting of one hundred and forty-four of the bitline drivers.

16. The system of claim 10, wherein the memory tile is coupled to the first wordline bus, a second wordline bus, a first bitline bus, and a second bitline bus.

17. The system of claim 10, wherein the data circuit is to access the data state via a plurality of busses, wherein the plurality of busses consist of the first wordline bus, a second wordline bus, a first bitline bus, and a second bitline bus.

18. The system of claim 1, wherein one or more of the plurality of decks comprises a crosspoint array of non-volatile memory cells, wherein each of the plurality of memory cells comprise a material capable of being in two or more stable states to store a logic value, wherein the plurality of memory cells are accessed via a plurality of wordlines and bitlines, and wherein each memory cell of the plurality of memory cells is located at an intersection of one of the plurality of wordlines and one of the plurality of bitlines.

19. A method comprising:
- accessing a data state of a plurality of memory cells in a memory tile via a data circuit; and
- toggling a plurality of wordline drivers and a plurality of bitline drivers in a partition of a plurality of memory tiles in a plurality data shifting directions to select which one of the plurality of wordline drivers and the plurality of bitline drivers are in communication with the data circuit, wherein the plurality of data shifting directions consist of a no directional shift, a first directional shift, a second directional shift that is orthogonal to the first directional shift, and a third directional shift that is diagonal to the first and second directional shifts.

20. The method of claim 19, wherein the data circuit is to access the data state via a plurality of drivers, wherein the plurality of drivers consist of a first wordline driver and a second wordline driver of the plurality of wordline drivers and via a first bitline driver and a second bitline driver of the plurality of bitline drivers.

* * * * *